(12) United States Patent
Du et al.

(10) Patent No.: US 12,154,611 B2
(45) Date of Patent: Nov. 26, 2024

(54) APPARATUSES AND METHODS FOR SAMPLE RATE ADJUSTMENT

(71) Applicant: MICRON TECHNOLOGY, INC., Boise, ID (US)

(72) Inventors: Bin Du, Shanghai (CN); Liang Li, Shanghai (CN)

(73) Assignee: Micron Technology, Inc., Boise, ID (US)

( * ) Notice: Subject to any disclaimer, the term of this patent is extended or adjusted under 35 U.S.C. 154(b) by 131 days.

(21) Appl. No.: 17/650,622

(22) Filed: Feb. 10, 2022

(65) Prior Publication Data

US 2023/0253025 A1 Aug. 10, 2023

(51) Int. Cl.
G11C 11/406 (2006.01)

(52) U.S. Cl.
CPC .............................. *G11C 11/40626* (2013.01)

(58) Field of Classification Search
CPC .............................................. G11C 11/40626
USPC ........................................................ 365/222
See application file for complete search history.

(56) References Cited

U.S. PATENT DOCUMENTS

| | | | |
|---|---|---|---|
| 5,299,159 A | 3/1994 | Balistreri et al. |
| 5,943,283 A | 8/1999 | Wong et al. |
| 6,977,824 B1 | 12/2005 | Yang et al. |
| 7,061,225 B2 | 6/2006 | Yang et al. |
| 7,061,780 B2 | 6/2006 | Yang et al. |
| 7,830,742 B2 | 11/2010 | Han |
| 8,625,360 B2 | 1/2014 | Iwamoto et al. |
| 8,811,100 B2 | 8/2014 | Ku |
| 9,032,141 B2 | 5/2015 | Bains et al. |
| 9,117,544 B2 | 8/2015 | Bains et al. |
| 9,478,316 B1 | 10/2016 | Ryu |
| 9,805,783 B2 | 10/2017 | Ito et al. |
| 9,928,896 B1 | 3/2018 | Kim et al. |
| 10,003,328 B1 | 6/2018 | Yin et al. |
| 10,032,501 B2 | 7/2018 | Ito et al. |
| 10,170,174 B1 | 1/2019 | Ito et al. |
| 10,418,978 B1 | 9/2019 | Au Yeung et al. |
| 10,672,449 B2 | 6/2020 | Ito et al. |

(Continued)

FOREIGN PATENT DOCUMENTS

| CN | 1591696 A | 3/2005 |
|---|---|---|
| CN | 1783338 A | 6/2006 |

(Continued)

OTHER PUBLICATIONS

U.S. Appl. No. 16/025,844, titled "Apparatus and Methods for Triggering Row Hammer Address Sampling", filed Jul. 2, 2018, pp. all pages of application as filed.
U.S. Appl. No. 16/268,818, titled "Apparatuses and Methods for Managing Row Access Counts", filed Feb. 6, 2019, pp. all pages of application as filed.

(Continued)

*Primary Examiner* — Anthan Tran
(74) *Attorney, Agent, or Firm* — Dorsey & Whitney LLP

(57) ABSTRACT

Apparatuses, systems, and methods for sample rate adjustment. A memory may sample row addresses based on a sampling rate to determine aggressor addresses. The memory includes a sample adjustment circuit which monitors a rate of refresh operations and adjusts the sampling rate based on the monitored rate. The sample adjustment circuit may provide a calculated temperature value based on the monitored rate, and the calculated temperature may be used to set a sampling rate. The refresh rate may be based on a measured temperature.

11 Claims, 7 Drawing Sheets

(56) References Cited

U.S. PATENT DOCUMENTS

| | | |
|---|---|---|
| 11,062,754 B2 | 7/2021 | Ito et al. |
| 2004/0130959 A1 | 7/2004 | Kawaguchi |
| 2007/0058462 A1 | 3/2007 | Blodgett |
| 2008/0181048 A1 | 7/2008 | Han |
| 2010/0329069 A1 | 12/2010 | Ito et al. |
| 2011/0299352 A1 | 12/2011 | Fujishiro et al. |
| 2011/0310648 A1 | 12/2011 | Iwamoto et al. |
| 2012/0155206 A1 | 6/2012 | Kodama et al. |
| 2012/0327734 A1 | 12/2012 | Sato |
| 2014/0006703 A1 | 1/2014 | Bains et al. |
| 2014/0006704 A1 | 1/2014 | Greenfield et al. |
| 2014/0095786 A1 | 4/2014 | Moon et al. |
| 2014/0237307 A1 | 8/2014 | Kobla et al. |
| 2014/0241099 A1 | 8/2014 | Seo et al. |
| 2014/0281206 A1 | 9/2014 | Crawford et al. |
| 2015/0089326 A1 | 3/2015 | Joo et al. |
| 2015/0213872 A1 | 7/2015 | Mazumder et al. |
| 2015/0255140 A1 | 9/2015 | Song |
| 2015/0294711 A1 | 10/2015 | Gaither et al. |
| 2015/0380073 A1 | 12/2015 | Joo et al. |
| 2016/0078911 A1 | 3/2016 | Fujiwara et al. |
| 2016/0086649 A1 | 3/2016 | Hong et al. |
| 2016/0125931 A1 | 5/2016 | Doo et al. |
| 2016/0196863 A1 | 7/2016 | Shin et al. |
| 2016/0352518 A1 | 12/2016 | Ford et al. |
| 2017/0263305 A1 | 9/2017 | Cho |
| 2017/0287547 A1 | 10/2017 | Ito et al. |
| 2018/0005690 A1 | 1/2018 | Morgan et al. |
| 2018/0025770 A1 | 1/2018 | Ito et al. |
| 2018/0158507 A1 | 6/2018 | Bang |
| 2018/0182445 A1 | 6/2018 | Lee et al. |
| 2018/0261268 A1 | 9/2018 | Hyun et al. |
| 2018/0308539 A1 | 10/2018 | Ito et al. |
| 2019/0122722 A1 | 4/2019 | Yamada et al. |
| 2019/0122723 A1 | 4/2019 | Ito et al. |
| 2019/0139599 A1 | 5/2019 | Ito et al. |
| 2019/0237131 A1 | 8/2019 | Ito |
| 2019/0354312 A1 | 11/2019 | Chew et al. |
| 2019/0371390 A1 | 12/2019 | Ito |
| 2020/0211634 A1 | 7/2020 | Ishikawa et al. |
| 2020/0265888 A1 | 8/2020 | Ito et al. |
| 2020/0342934 A1* | 10/2020 | Lee .................. G11C 11/40618 |
| 2022/0189537 A1* | 6/2022 | Kim ...................... G06F 3/0644 |

FOREIGN PATENT DOCUMENTS

| | | |
|---|---|---|
| CN | 101026006 A | 8/2007 |
| CN | 101300641 A | 11/2008 |
| CN | 103377695 A | 10/2013 |
| CN | 105304115 A | 2/2016 |
| JP | 2005-216429 A | 8/2005 |
| JP | 2011-258259 A | 12/2011 |
| JP | 2013-004158 A | 1/2013 |
| WO | 2017171927 A1 | 10/2017 |
| WO | 2019079157 A1 | 4/2019 |
| WO | 2019083884 A1 | 5/2019 |

OTHER PUBLICATIONS

U.S. Appl. No. 16/869,359, titled "Apparatus and Methods for Refreshing Memory", filed May 7, 2020, pp. all pages of application as filed.

U.S. Appl. No. 15/881,256 entitled 'Apparatuses and Methods for Detecting a Row Hammer Attack With a Bandpass Filter' filed Jan. 26, 2018, pp. all pages of application as filed.

U.S. Appl. No. 16/699,977, titled "Apparatuses and Methods for Access Based Random Sampling", filed Dec. 2, 2019, pp. all pages of application as filed.

U.S. Appl. No. 15/789,897, entitled "Apparatus and Methods for Refreshing Memory", filed Oct. 20, 2017, pp. all pages of application as filed.

U.S. Appl. No. 15/796,340, entitled: "Apparatus and Methods for Refreshing Memory" filed Oct. 27, 2017, pp. all pages of application as filed.

U.S. Appl. No. 16/012,679, titled "Apparatuses and Methods for Multiple Row Hammer Refresh Address Sequences", filed Jun. 19, 2018, pp. all pages of application as filed.

U.S. Appl. No. 16/020,863, titled "Semiconductor Device", filed Jun. 27, 2018, pp. all pages of application as filed.

U.S. Appl. No. 16/176,932, titled "Apparatuses and Methods for Access Based Refresh Timing", filed Oct. 31, 2018, pp. all pages of application as filed.

U.S. Appl. No. 16/228,446, titled "Apparatuses and Methods for Variable Address Sample Timing", filed Dec. 20, 2018, pp. all pages of application as filed.

U.S. Appl. No. 16/228,484, titled "Apparatuses and Methods for Sample Signal Timing With Multiple Clocks", filed Dec. 20, 2018, pp. all pages of application as filed.

U.S. Appl. No. 16/237,291, titled "Apparatus and Methods for Refreshing Memory", filed Dec. 31, 2018, pp. all pages of application as filed.

U.S. Appl. No. 16/452,196 titled "Apparatuses and Methods for Address Sampling Randomization" filed Jun. 25, 2019, pp. all pages of application as filed.

U.S. Appl. No. 16/545,489 titled "Apparatuses and Methods for Detecting a Row Hammer Attack With a Bandpass Filter" filed Aug. 20, 2019, pp. all pages of application as filed.

U.S. Appl. No. 16/816,017, titled "Apparatuses and Methods for Sample Signal Timing With Multiple Clocks", dated Mar. 11, 2020, pp. all pages of application as filed.

U.S. Appl. No. 15/876,566 entitled 'Apparatuses and Methods for Calculating Row Hammer Refresh Addresses in a Semiconductor Device' filed Jan. 22, 2018, pp. all pages of application as filed.

PCT Application No. PCT/US18/55821 "Apparatus and Methods for Refreshing Memory" filed Oct. 15, 2018, pp. all pages of application as filed.

U.S. Appl. No. 15/715,846, entitled "Semiconductor Device", filed Sep. 26, 2017, pp. all pages of application as filed.

U.S. Appl. No. 16/386,775 titled "Apparatuses and Methods for Random Signal Generation" filed Apr. 17, 2019, pp. all pages of application as filed.

U.S. Appl. No. 15/281,818, titled: "Semiconductor Device" filed Sep. 30, 2016, pp. all pages of application as filed.

Kim, et al., "Flipping Bits in MemoryWithout Accessing Them: An Experimental Study of DRAM Disturbance Errors", IEEE, Jun. 2014, 12 pgs.

* cited by examiner

APPARATUSES AND METHODS FOR SAMPLE RATE ADJUSTMENT

BACKGROUND

This disclosure relates generally to semiconductor devices, and more specifically to semiconductor memory devices. In particular, the disclosure relates to volatile memory, such as dynamic random access memory (DRAM). Information may be stored on individual memory cells of the memory as a physical signal (e.g., a charge on a capacitive element). The memory may be a volatile memory, and the physical signal may decay over time (which may degrade or destroy the information stored in the memory cells). It may be necessary to periodically refresh the information in the memory cells by, for example, rewriting the information to restore the physical signal to an initial value.

Certain access patterns of the memory may cause increased rate of data degradation of memory cells in other nearby memory cells. To prevent information from being lost, it may be important to locate these memory cells so they can be refreshed.

DETAILED DESCRIPTION

Figure 1:
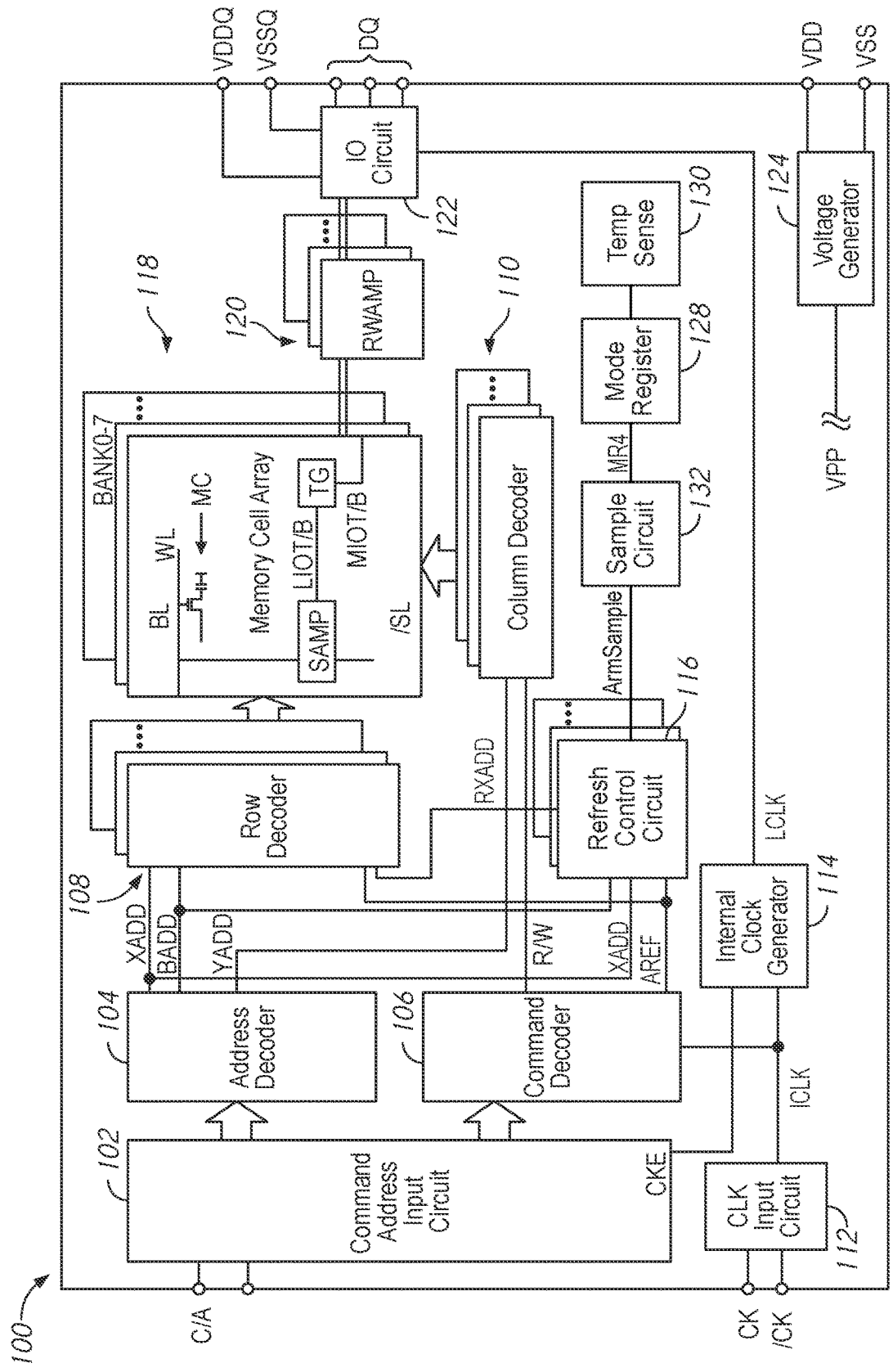
FIG. 1 is a block diagram of a semiconductor device according an embodiment of the disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Information in a volatile memory device may be stored in memory cells (e.g., as a charge on a capacitive element), and may decay over time. The memory cells may be organized into rows (wordlines) and columns (bit lines), in each bank of a memory array. The memory cells may be refreshed on a row-by-row basis. The memory may perform a refresh cycle by performing refresh operations on the wordlines of the memory in a sequence such that over time the wordlines of the memory are refreshed at a rate faster than the expected rate of data degradation.

Repeated accesses to a given row (e.g., a row hammer) may cause an increased rate of data degradation in the memory cells along nearby rows. The memory may track access patterns to identify hammered 'aggressor' rows so that the 'victim' rows can be refreshed as part of a targeted refresh operation. Since it may be impractical to monitor every single access operation, the memory may sample access operations to monitor for aggressor rows. It may be important to match a rate at which addresses are sampled to a rate at which targeted refresh operations are performed. The memory may normally keep these rates matched based on various settings and properties of the memory (e.g., a current temperature of the memory). However, the memory may also receive commands from a controller, such as refresh management (RFM) commands, which cause the memory to perform a targeted refresh address. These commands may cause a mismatch between the sampling rate and the targeted refresh rate. It may be important to monitor the actual refresh rate being performed by the memory and adjust the sampling rate accordingly.

The present disclosure is drawn to apparatuses, systems, and methods for sampling rate adjustment. The memory includes a sampling circuit which generates activations of a sampling signal. Responsive to each activation of the sampling signal, a current row address is sampled. The sampling signal may be generated in a manner which is, in part, random, however the overall rate may be based on various properties of the memory, such as a temperature of the memory. The temperature may also influence a rate of refresh operations and the ratio of targeted to CBR refresh operations. However, that ratio may be further adjusted by commands, such as RFM commands from the controller, which are not reflected in the settings of the memory. A sampling rate adjustor circuit monitors the actual rate of performed refresh operations and adjusts the sampling rate based on the measured actual rate.

In an example embodiment, the sample rate adjustor circuit may count a number of refresh operations during a refresh measurement period. The counted number of refresh operations is compared to an amount of refresh operations expected based on a mode register temperature value. Based on the counted number of refresh operations, a calculated temperature value is determined. The calculated temperature value is provided to the sampling circuit, which sets the sampling rate based on the calculated temperature value (e.g., instead of the true measured temperature value in the mode register).

In another example embodiment, the sample rate adjustor circuit may adjust a count value based on an RHR signal which indicates a targeted refresh operation and on the sample signal. Each time the RHR signal is received, the count is changed in a first direction (e.g., incremented). Each time the sampling signal is received, the count is changed in a second direction (e.g., decremented). If the count value moves outside a range of tolerances (e.g., passes an upper or lower threshold), then the sampling rate is adjusted.

FIG. 1 is a block diagram of a semiconductor device according an embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. For example, some memories, such as LPDDR5 may include 16 banks (e.g., BANK0 to BANK15).

Each memory bank includes a plurality of word lines WL, a plurality of bit lines BL and /BL, and a plurality of memory cells MC arranged at intersections of the plurality of word lines WL and the plurality of bit lines BL and /BL. The selection of the word line WL is performed by a row decoder 108 and the selection of the bit lines BL and /BL is performed by a column decoder 110. In the embodiment of FIG. 1, the row decoder 108 includes a respective row decoder for each memory bank and the column decoder 110 includes a respective column decoder for each memory bank. The bit lines BL and /BL are coupled to a respective sense amplifier (SAMP). Read data from the bit line BL or /BL is amplified by the sense amplifier SAMP, and transferred to read/write amplifiers 120 over complementary local data lines (LIOT/B), transfer gate (TG), and complementary main data lines (MIOT/B). Conversely, write data outputted from the read/write amplifiers 120 is transferred to the sense amplifier SAMP over the complementary main data lines MIOT/B, the transfer gate TG, and the complementary local data lines LIOT/B, and written in the memory cell MC coupled to the bit line BL or /BL.

The semiconductor device 100 may employ a plurality of external terminals that include command and address (C/A) terminals coupled to a command and address bus to receive commands and addresses, and a CS signal, clock terminals to receive clocks CK and /CK, data terminals DQ to provide data, and power supply terminals to receive power supply potentials VDD, VSS, VDDQ, and VSSQ.

The clock terminals are supplied with external clocks CK and /CK that are provided to an input circuit 112. The external clocks may be complementary. The input circuit 112 generates an internal clock ICLK based on the CK and /CK clocks. The ICLK clock is provided to the command decoder 106 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The device 100 may receive an access command which is a read command. When a read command is received, and a bank address, a row address and a column address are timely supplied with the read command, read data is read from memory cells in the memory array 118 corresponding to the row address and column address. The read command is received by the command decoder 106, which provides internal commands so that read data from the memory array 118 is provided to the read/write amplifiers 120. The read data is output to outside from the data terminals DQ via the input/output circuit 122.

The device 100 may receive an access command which is a write command. When the write command is received, and a bank address, a row address and a column address are timely supplied with the write command, write data supplied to the data terminals DQ is written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 to the read/write amplifiers 120, and by the read/write amplifiers 120 to the memory array 118 to be written into the memory cell MC.

The device 100 may also receive commands causing it to carry out one or more refresh operations as part of a refresh mode. In some embodiments, the refresh mode command may be externally issued to the memory device 100. In some embodiments, the refresh mode command may be periodically generated by a component of the device. In some embodiments, when an external signal indicates a refresh entry command, the refresh signal AREF may also be activated. The refresh signal AREF may be used to control the timing of refresh operations during the refresh mode. The signal AREF may be generated with periodic timing during the refresh mode. Thus, refresh operations may continue automatically. A refresh mode exit command (which may be from an external controller and/or may be internally generated) may cause the periodic activation of the refresh signal AREF to stop and may cause the device 100 to return to an idle state and/or resume other operations.

The refresh signal AREF is supplied to the refresh control circuit 116. The refresh control circuit 116 supplies a refresh row address RXADD to the row decoder 108, which may refresh one or more wordlines WL indicated by the refresh row address RXADD. In some embodiments, the refresh address RXADD may represent a single wordline. In some embodiments, the refresh address RXADD may represent multiple wordlines, which may be refreshed sequentially or simultaneously by the row decoder 108. For example, the refresh address RXADD may be truncated compared to the row address XADD, and the refresh address RXADD may be associated with every word line which shares the non-truncated portion of the address in common. The refresh control circuit 116 may control a timing of the refresh operation, and may generate and provide the refresh address RXADD. The refresh control circuit 116 may be controlled to change details of the refreshing address RXADD (e.g., how the refresh address is calculated, the timing of the refresh addresses, the number of wordlines represented by the address), or may operate based on internal logic.

The refresh control circuit 116 may selectively output a targeted refresh address which specifies one or more victim address based on an identified aggressor wordline or an automatic refresh address (e.g. a CAS before RAS or CBR address) which is part of a sequence of addresses as the refresh address RXADD. Based on the type of refresh address RXADD (and in some embodiments, one or more additional signals indicating the type of operation), the row decoder 108 may perform a targeted refresh or CBR refresh operation. The automatic refresh addresses may be generated as part of a sequence of addresses which are intended to refresh all of the word lines in the memory array 118. The refresh control circuit 116 may cycle through the sequence of refresh addresses at a rate determined by AREF. The auto-refresh operations may generally occur with a timing such that the sequence of CBR addresses is cycled such that no information is expected to degrade in the time between refresh operations for a given wordline. In other words, refresh operations may be performed such that each wordline is refreshed at a rate faster than the expected rate of information decay.

The refresh control circuit 116 may also determine targeted refresh addresses which are addresses that require refreshing (e.g., victim addresses corresponding to victim rows) based on the access pattern of nearby addresses (e.g., aggressor addresses corresponding to aggressor rows) in the memory array 118. The refresh control circuit 116 may use one or more signals of the device 100 to calculate the targeted refresh address RXADD. For example, the refresh address RXADD may be a calculated based on the row addresses XADD provided by the address decoder and sampled by the refresh control circuit 116.

To locate and identify aggressor rows, the refresh control circuit 116 samples the current value of XADD along the row address bus. As described in more detail herein, various techniques may be used to determine when the row address is sampled, which may include an element of randomness. The sampling may also be based on various settings or properties of the memory. For example, the memory 100 includes a temperature sensor 130, which measures a temperature of the memory. The temperature sensor 130 updates a value MR4 in a mode register 128 which represents the temperature of the memory 100. The sampling rate may be based, in part on the value of MR4. For example, the refresh control circuit 116 may generate a sampling signal in a manner which is, at least in part, random in time, with a sampling signal generated once each sampling interval, but at a random time within that interval. The value of MR4 may be used to set a length of the sampling interval. While the term MR4 is used to refer to the measured temperature value in the mode register 128, it should be understood that the temperature may be located anywhere within the structure of the mode register 128 and is not limited to a $4^{th}$ mode register.

The refresh control circuit 116 may use internal logic to determine when to perform a CBR refresh operation and when to perform a targeted refresh operation. For example, every time some number of CBR refresh operations are performed, a set of targeted refresh operations are performed. In addition to using internal logic, the memory device 100 may receive a refresh management (RFM) command from a controller. The RFM command causes the refresh control circuit 116 to perform a targeted refresh operation, even if no refresh operation would otherwise be called for.

A sampling circuit 132 monitors the rate of refresh operations and adjusts the rate at which the sampling signal ArmSample is provided. For example, if a large number of refresh operations are being performed then the sampling circuit 132 may increase the rate of sampling (e.g., reduce the sampling interval). If few refresh operations are being performed, then the sampling adjustment circuit 132 may decrease the rate of sampling. The sampling circuit 132 may monitor the overall rate of all refresh operations and/or may monitor the rate of targeted refresh operations. In some embodiments, the sampling circuit 132 may provide sampling signal ArmSample in common to a number of refresh control circuits 116, each of which may be associated with one of the memory banks. Example sampling adjustment circuits and their operations are described in more detail in FIGS. 3-6.

The power supply terminals are supplied with power supply potentials VDD and VSS. The power supply potentials VDD and VSS are supplied to an internal voltage generator circuit 124. The internal voltage generator circuit 124 generates various internal potentials VPP and other internal voltages based on the power supply potentials VDD and VSS supplied to the power supply terminals.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
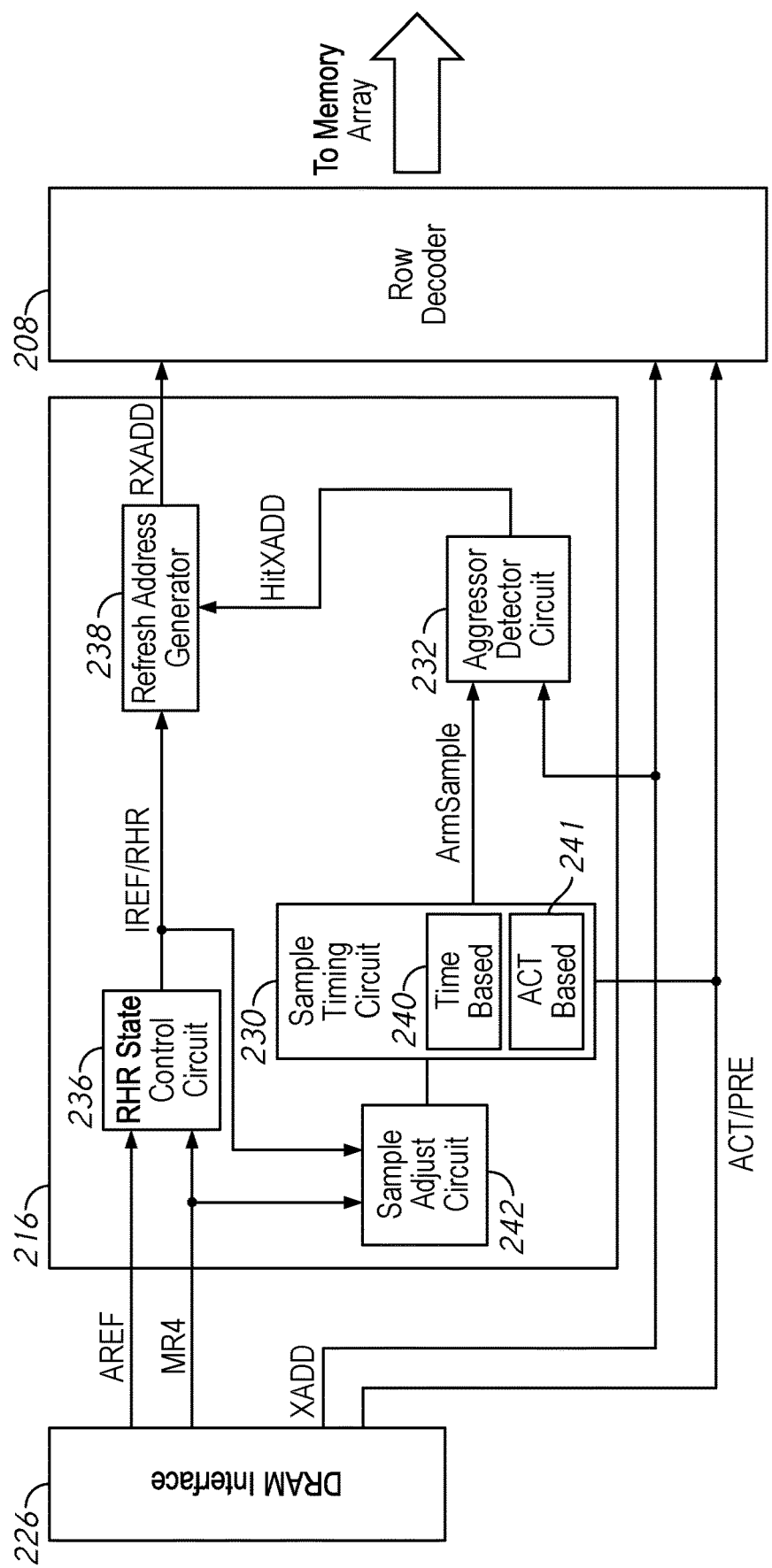
FIG. 2 is a block diagram of a refresh control circuit according to an embodiment of the present disclosure.

FIG. 2 is a block diagram of a refresh control circuit according to an embodiment of the present disclosure. The refresh control circuit 216 may, in some embodiments, be included in the refresh control circuit 116 of FIG. 1. Certain internal components and signals of the refresh control circuit 216 are shown to illustrate the operation of the refresh control circuit 216. The refresh control circuit 216 and row decoder 208 may correspond to a particular bank of memory, and one or more of these components may be repeated for each of the banks of memory. Some components may be shared in common by multiple bank level components. For example, there may be an aggressor detector circuit 232 and refresh address generator 238 for each bank of memory, but the sample timing circuit 230 may provide the signal ArmSample in common to each of the bank level aggressor detector circuit 232.

A DRAM interface 226 may provide one or more signals to an address refresh control circuit 216 and row decoder 208. The refresh control circuit 216 may include a sample timing circuit 230, an aggressor detector circuit 232, a row hammer refresh (RHR) state control circuit 236 and a refresh address generator 238. The DRAM interface 226 may provide one or more control signals, such as a refresh signal AREF, and a row address XADD. The refresh control circuit 216 provides refresh address RXADD with timing based on the refresh signal AREF, wherein some of the refresh addresses are based on the received row address XADD.

The aggressor detector circuit 232 (which may be a per-bank circuit) samples the current row address XADD responsive to an activation a sampling signal ArmSample (which may be provided in common to the different aggressor detector circuits 232). The aggressor detector circuit 232 may be coupled to the row addresses XADD along the address bus, but may only receive (e.g., process, pay attention to) the current value of the row address XADD when there is an activation of the sampling signal ArmSample or may receive a next row address XADD after each activation of ArmSample. The sampled addresses may be stored in the aggressor circuit 232 and/or compared to previously stored addresses. The aggressor detector circuit 232 may provide a match address HitXADD (e.g., an identified aggressor address) based on a currently sampled row address XADD and bank address BADD and/or previously sampled row addresses and bank addresses. The aggressor address HitXADD may be a sampled/stored row address and may be directed to bank level circuits (e.g., local aggressor storage 238) based on the bank address BADD which was sampled/stored along with the sampled stored row address.

The RHR state control circuit 236 may provide the signal RHR to indicate that targeted refresh operation (e.g., a refresh of the victim rows corresponding to an identified aggressor row) should occur. The RHR state control circuit 236 may also provide an internal refresh signal IREF, to indicate that a refresh operation should occur. If IREF is active, but RHR is not, then a CBR refresh may be performed. Responsive to an activation of the signal RHR, the refresh address generator 238 may provide a refresh address RXADD, which may be one or more victim addresses corresponding to victim rows of the aggressor row corresponding to the match address HitXADD provided by the aggressor detector circuit 232. The aggressor detector circuit 232 may include a queue of identified aggressor addresses, and provide an address HitXADD when a targeted refresh operation is called for.

Responsive to an activation of IREF but not RHR, the refresh address generator 238 may provide a CBR refresh address RXADD. The CBR refresh address may be generated based on a sequence of addresses. For example, a counter may increment a previous CBR refresh address to generate a next CBR refresh address.

The RHR state control circuit 236 may provide a set of activations of RHR and IREF responsive to the refresh signal AREF, representing a number of refresh pumps to each activation of the refresh signal AREF. The row decoder 208 may perform a targeted refresh operation responsive to the refresh address RXADD and the row hammer refresh signal RHR. The row decoder 208 may perform a CBR refresh operation based on the refresh address RXADD and the internal refresh signal IREF.

The DRAM interface 226 may represent one or more components which provides signals to components of the bank. In some embodiments, the DRAM interface 226 may represent a memory controller coupled to the semiconductor memory device (e.g., device 100 of FIG. 1). In some embodiments, the DRAM interface 226 may represent components such as the command address input circuit 102, the address decoder 104, and/or the command decoder 106 of FIG. 1. The DRAM interface 226 may provide a row address XADD, a bank address BADD the refresh signal AREF, and access signals such as an activation signal ACT and a pre-charge signal PRE. The refresh signal AREF may be a periodic signal which may indicate when a CBR refresh operation is to occur. The access signals ACT and PRE may generally be provided as part of an access operation along with a row address XADD. The activation signal ACT may be provided to activate a bank and row of the memory associated with the associated bank and row address. The pre-charge signal PRE may be provided to pre-charge the bank and row of the memory specified by the bank and row address. The row address XADD may be a signal including multiple bits (which may be transmitted in series or in parallel) and may correspond to a specific row of an activated memory bank.

The DRAM interface 226 may also provide a mode register signal MR4, which represents a temperature of the memory. For example, the value MR4 may be set based on measurements from a temperature sensor (e.g., 130 of FIG. 1).

In the example embodiment of FIG. 2, the refresh control circuit 216 uses sampling to monitor a portion of the addresses XADD provided along the address bus. Accordingly, instead of responding to every address, the refresh control circuit 216 may sample the current value of the address XADD on the address bus, and may determine which addresses are aggressors based on the sampled addresses. The timing of sampling by the refresh control circuit 216 may be controlled by the sample timing circuit 230 which provides the sampling signal ArmSample. The sample timing circuit 230 may provide activations of the sampling signal ArmSample, and each activation of the signal ArmSample may indicate that a current value of the row address should be sampled. An activation of ArmSample may be a 'pulse', where ArmSample is raised to a high logic level and then returns to a low logic level. The activations of the signal ArmSample may be provided with periodic timing, random timing, semi-random timing, pseudo-random timing, timing based on one or more signals (e.g., ACT/PRE) or combinations thereof.

The sample timing circuit 230 uses a mixture of time based logic 240 and activation based logic 241 to determine when the signal ArmSample should be provided. For example, the activation based logic 241 may provide an activation based sample signal ArmSampleA based on activations of the signal ACT. For example, the activation based logic 241 may provide the signal ArmSampleA after N activations of ACT, where the value N may change (e.g., be randomly varied) each time ArmSampleA is provided. In another example, the signal ArmSampleA may be randomly provided with 1/M odds (where M is a system setting, is randomly varied, etc.) each time ACT is received.

The time based logic 240 provides activations of a time based sampling signal ArmSampleT based on time (e.g., a number of clock cycles, an internal oscillator, etc.). For example, the time based logic 240 may use a sampling period Ts (e.g., a number of clock cycles), and may provide an activation of ArmSampleT at a random point somewhere within each sampling period. Various other methods may also be used to generate ArmSampleT. The time based logic 240 may control a rate at which the signal ArmSampleT is provided. For example, the sampling period Ts may be variable, and may increase or decrease in length. The overall sampling signal ArmSample may be provided based on ArmSampleA and ArmSampleT. For example, in some embodiments OR logic may be used and ArmSample may be provided whenever either ArmSampelA or ArmSampleT is active. In some embodiments, ArmSampleA and the activation based logic 241 may be omitted, and ArmSampleT may be used as the sampling signal ArmSample A sample adjustment control a rate at which ArmSample is provided, based on information about the rate at which refresh operations are being performed. Various factors may effect a rate at which refresh operations are performed, and the proportion of targeted refresh to CBR refresh operations. For example, the temperatures value MR4 may partially determine a rate at which refresh operations are performed (with more refresh operations at higher temperatures) and also increase a proportion of targeted refresh operations (with more targeted refresh operations at higher temperatures). However, external factors, like RFM commands, may also increase the proportion of targeted refresh operations. Accordingly, the sample adjust circuit 242 may measure the rate of refresh operations and/or the rate of targeted refresh operations, and use that measurement to adjust the rate at which ArmSample is provided (e.g., instead of relying on MR4 for adjustment).

For example, the sample rate adjustment circuit 242 may count a number of refresh operations (e.g., by counting IREF) within a measurement window. Based on that count, the sample rate adjustment circuit may calculate an effective MR4 value and provide the calculated MR4 value to the time based logic. The calculated MR4 value is a synthetic value used to adjust sampling rate, and is not necessarily a reflection of the temperature measurement. For example, if a large number of refresh operations are counted, then a calculated MR4 value may be generated to increase a sampling rate, even if the temperature of the memory hasn't changed. An example sample rate adjustment circuit which uses a measurement window is discussed in more detail in FIGS. 3-4.

In another example, the sample rate adjustment circuit 242 may adjust a count value based on targeted refresh operations (e.g., activations of RHR) and based on Arm-SampleT. For example, the count may be changed in a first direction (e.g., incremented) responsive to activations of RHR and may be changed in a second direction (e.g., decremented) responsive to ArmSampleT. When the count value leaves an envelope (e.g., crosses an upper or lower threshold) the count value is reset and the sample rate adjustment circuit 242 changes the rate at which ArmSampleT is provided. For example, the sample rate adjustment circuit 242 may receive the temperature value MR4 and dynamically adjust the value of MR4 based on the count value and provide adjusted value MR4 to the time based sampling logic 240. An example sample rate adjustment circuit which uses dynamic adjustment of MR4 is discussed in more detail in FIGS. 5-6.

The aggressor detector circuit 232 may determine aggressor addresses based on one or more of the sampled row and bank addresses, and then may provide the determined aggressor address as the match address HitXADD. The aggressor detector circuit 232 may include a data storage unit (e.g., a number of registers), which may be used to store sampled row and bank addresses. When the aggressor detector circuit 232 samples a new value of the row address XADD (e.g., responsive to an activation of ArmSample) it may compare the sampled row and bank address to the row/bank addresses stored in the data storage unit. In some embodiments, the match address HitXADD may be one of the addresses stored in the aggressor detector circuit 232 which has been matched by the sampled addresses the most frequently.

The RHR state control circuit 236 may receive the refresh signal AREF and provide the refresh signal IREF and the row hammer refresh signal RHR. The refresh signal AREF may be periodically generated and may be used to control the timing of refresh operations. The memory device may carry out a sequence of refresh operations using CBR addresses (e.g., a CBR refresh), such as auto-refresh or self-refresh operations, in order to periodically refresh the rows of the memory device. The RHR signal may be generated in order to indicate that the device should refresh a particular targeted row (e.g., a victim row) instead of an address from the sequence of CBR refresh addresses. The RHR state control circuit 236 may also provide an internal refresh signal IREF, which may indicate that an refresh operation using an CBR address should take place. In some embodiments, the signals RHR and IREF may be generated such that they are not active at the same time (e.g., are not both at a high logic level at the same time). In some embodiments, IREF may be activated for every refresh operation, and an refresh operation using a CBR address may be performed unless RHR is also active, in which case a targeted refresh operation is performed instead.

In some embodiments, the refresh control circuit 216 may perform multiple refresh operations responsive to each activation of the refresh signal AREF. For example, each time the refresh signal AREF is received, the refresh control circuit 216 may perform N different refresh operations, by providing N different refresh addresses RXADD. Each refresh operation may be referred to as a 'pump'. The different pumps generated in response to the refresh signal AREF may be a mix of CBR refresh and targeted refresh operations. For example, if 4 pumps are generated, two may be used for CBR refresh operations and two may be used for targeted refresh operations. Other patterns may be used in other embodiments. In some embodiments, the pattern of targeted and CBR refresh operations may vary between different groups of pumps. The RHR state control circuit 236 may adjust the pattern of targeted and CBR refresh operations, based, in part, on the temperature value MR4.

The refresh address generator 238 may receive the row hammer refresh signal RHR and the match address HitXADD. The match address HitXADD may represent an aggressor row. The targeted refresh address generator 238 may determine the locations of one or more victim rows based on the match address HitXADD and provide them as the refresh address RXADD when the signal RHR indicates a targeted refresh operation. In some embodiments, the victim rows may include rows which are physically adjacent to the aggressor row (e.g., HitXADD+1 and HitXADD−1). In some embodiments, the victim rows may also include rows which are physically adjacent to the physically adjacent rows of the aggressor row (e.g., HitXADD+2 and HitXADD−2). Other relationships between victim rows and the identified aggressor rows may be used in other examples. For example, +/−3, +/−4, and/or other rows may also be refreshed.

The row decoder 208 may perform one or more operations on the memory array (not shown) based on the received signals and addresses. For example, responsive to the activation signal ACT and the row address XADD (and IREF and RHR being at a low logic level), the row decoder 208 may direct one or more access operations (for example, a read operation) on the specified row address XADD. Responsive to the IREF and/or RHR signal being active, the row decoder 208 may refresh the refresh address RXADD.

The refresh address generator 238 may generate an CBR refresh address (or CBR refresh address) RXADD based on the signal IREF (e.g., when RHR is not active). The refresh address generator 238 may use logic to cycle through addresses for all of the word lines in the memory array. For example, the refresh address generator 238 may include a counter which increments a value of RXADD each time the signal IREF is received (when RHR is inactive). In some embodiments, the CBR refresh address RXADD may be associated with several word lines at once. For example, the CBR refresh address RXADD may be a truncated address which is shortened by some number of bits (e.g., the bits may be removed, or may be ignored).

Figure 3:
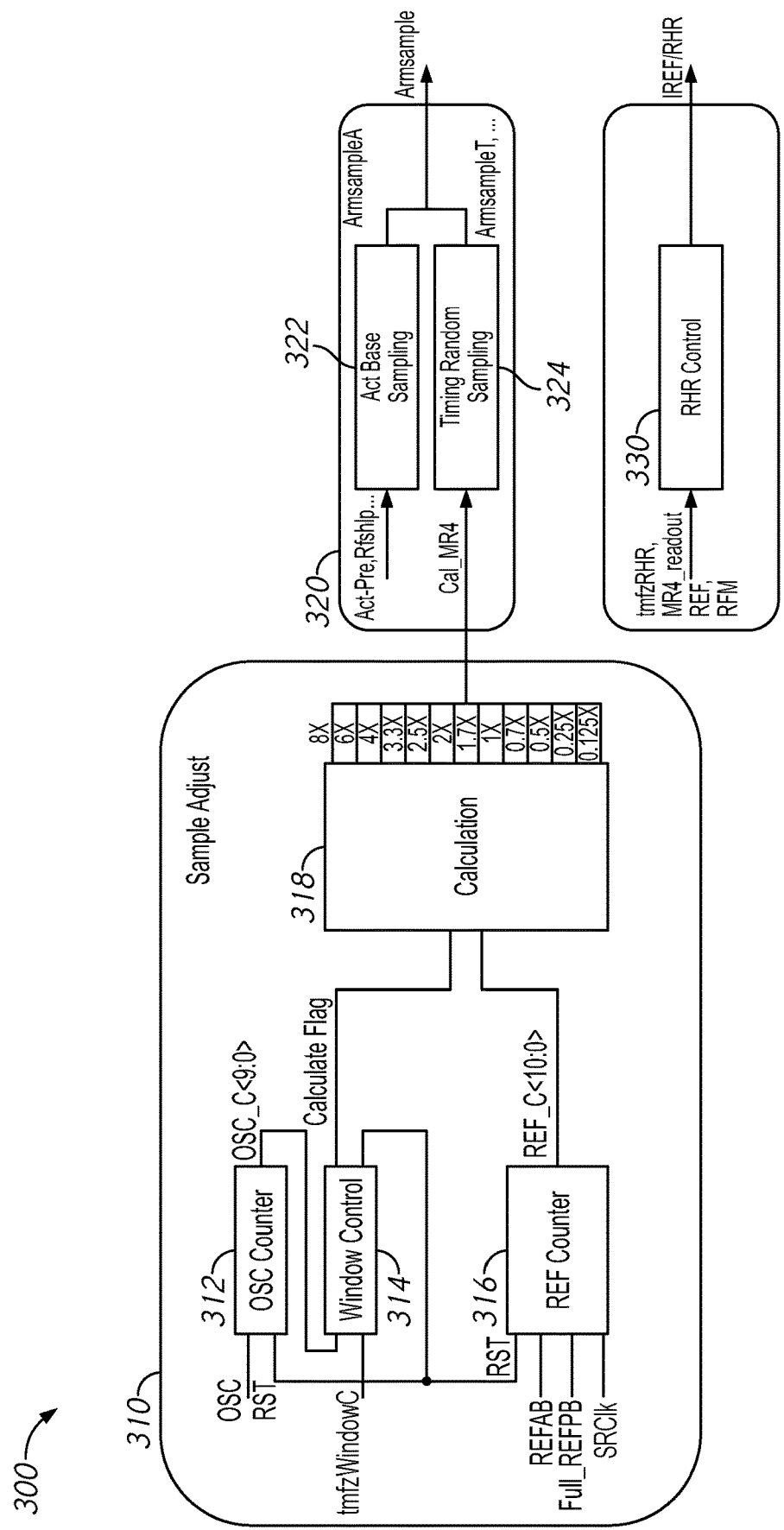
FIG. 3 is a block diagram of a refresh control circuit according to some embodiments of the present disclosure.

FIG. 3 is a block diagram of a refresh control circuit according to some embodiments of the present disclosure. The refresh control circuit 300 shows a portion of a refresh control circuit focused on the adjustment of a rate of a sampling signal. Other components and signals have been omitted from the view of FIG. 3 for brevity. The refresh control circuit 300 may, in some embodiments, be included in the refresh control circuit 116 of FIG. 1 and/or 216 of FIG. 2.

The refresh control circuit 300 includes a sample adjust circuit 310 (e.g., 242 of FIG. 2), which counts a number of refresh operation and provides a calculated temperature value Cal_MR4. The refresh control circuit 300 also includes a sample timing circuit 320 (e.g., 230 of FIG. 2) which adjusts a rate at which a sampling signal ArmSample is provided. The sample adjust circuit 300 also includes an RHR state control circuit 330 (e.g., 236 of FIG. 2) which determines when targeted refresh operations should be performed by providing a targeted refresh signal RHR.

The sample adjust circuit 310 includes an oscillator counter 312, a window control circuit 314, a refresh counter 316, and a calculation circuit 318. The oscillator counter 312 may count a number of activations of a oscillation signal OSC, which may be provided by an oscillator circuit (not shown). The oscillation signal OSC may be a periodic signal such as a clock signal. In some embodiments, the oscillation signal OSC may be based on one or more system clocks. In some embodiments, the oscillation signal OSC may be independent of the system clocks (e.g., free running). Each time the oscillator counter 312 receives an activation (e.g., a rising edge) of the oscillator signal OSC, it changes a window count value OSC_C (e.g., by incrementing the count value). In the example of FIG. 3, the count value OSC_C may be a 10-bit binary number, however other numbers of bits or other ways of expressing the count value may be used in other example embodiments. When the oscillator counter 312 receives a reset signal RST at an active level, the window count value OSC_C is reset to an initial value (e.g., 0).

The window control circuit 314 monitors the window count value OSC_C and provides a calculate flag Calculate_Flag and the reset signal RST at active levels when the count value OSC_C reaches a window threshold. In other words, the window control circuit 314 provides the calculate flag and reset signal each time a specified amount of time (e.g., as measured in cycles of OSC) passes. The window control circuit 314 may have a threshold value, and when the count OSC_C passes the threshold, the signals Calculate_Flag and RST are provided. In some embodiments, the value of the threshold may be a setting, such as a fuse setting. For example, a fuse setting value tmfzwindowC may be used to set the threshold.

The refresh counter 316 counts a number of refresh operations and provides a refresh count value. Various signals may be used to count refresh operations. An example set of signals are shown in FIG. 3, although other signals may be used in other example embodiments. For example, the refresh counter 316 receives a refresh-all bank REFAB signal, a full refresh-per bank Full_REFPB and a self-refresh clock signal SRClk. The signal REFAB may be a command (e.g., from command decoder 106 of FIG. 1) which indicates that a refresh operation should be performed on all banks (e.g., one refresh operation in each bank). The signal Full_REFPB (or REFPB) may be a command (e.g., from command decoder 106 of FIG. 1) which indicates that a specified bank should be refreshed in full (e.g., multiple refresh operations in a single bank). The signal SRClk may be a command (e.g., from command decoder 106 of FIG. 1) analogous to the signal AREF described in FIGS. 1-2, and may cause the memory to perform CBR and/or targeted refresh operations based on its internal logic. Each of these signals may cause the refresh counter 316 to change the refresh count REF_C. In the example of FIG. 3, the count value REF_C may be an 11-bit binary number, however other numbers of bits or other ways of expressing the count value may be used in other example embodiments. Similar to the oscillator counter 312, the refresh counter 316 may also receive the reset signal (e.g., at the end of a measurement window) and responsive to RST at an active level, reset the count value REF_C to an initial value (e.g., 0).

Different signals may cause the refresh counter 316 to change the refresh count value REF_C in different ways since each signal may indicate a different number of refresh operations. For example, the signal SRClk may cause the refresh counter 316 to increase the refresh count REF_C by one. The signal REFAB may increase the refresh count REF_C by one. The signal Full_REFBP may cause the refresh count REF_C to be increased by a number of refresh operations performed responsive to that command. For example, the count REF_C may be increased by 40.

The calculation circuit 318 receives the calculate flag Calculate_Flag and the refresh count REF_C. When Calculate_Flag is active (e.g., at the end of a measurement window), the calculation circuit 318 uses the refresh count REF_C to determine a calculated MR4 value Cal_MR4. The calculated MR4 value Cal_MR4 may be used to control a rate at which the sample signal ArmSample is provided by the sample timing circuit 320. The sample timing circuit 320 may use the calculated MR4 value Cal_MR4 in the place of the actual MR4 value (e.g., based on a measured temperature) stored in the mode register. The calculated MR4 value (analogous to the actual MR4 value) may express a ratio by which a rate of refresh operations should be changed. For example, a baseline rate may be determined based on various settings but a Cal_MR4 value of 2× may indicate that the baseline rate should be doubled.

The calculation circuit 318 may use binning to determine what value of Cal_MR4 to provide. For example, if REF_C is below a first threshold then a first value may be provided, if REF_C is between the first threshold and a second threshold, then a second value may be provided, and so forth. In the example of FIG. 3, twelve bins are shown, 0.125×, 0.25×, 0.5×, 0.7×, 1×, 1.7×, 2×, 2.5×, 3.3×, 4×, 6×, and 8×, however more or fewer bins and different values of bin may be used in other example embodiments. The number and values of bins of Cal_MR4 may match the number and type of bins of the actual MR4 value in the mode register.

The sample timing circuit 320 includes an ACT based sampling logic circuit 322 (e.g., 241 of FIG. 2) and timing based sampling logic 324 (e.g., 240 of FIG. 2). The ACT based sampling logic 322 provides a signal ArmSampleA based on signals such as the activation and pre-charge signals ACT/PRE. The timing based sampling logic 324 provides a signal ArmSampleT based on the calculated MR4 value Cal_MR4 provided by the sample adjustment circuit 310. The overall signal ArmSample is provided based on ArmSampleT and ArmSampleA.

A refresh state control circuit 330 (e.g., 236 of FIG. 2) provides various internal signals which control whether CBR or targeted refresh operations are performed (e.g., by providing IREF and/or RHR signals). The state control circuit 330 may use various signals to determine when and which type of signals to provide, such as fuse settings tmfzRHR, refresh signals REF, refresh management signals RFM, and the MR4 value from the mode register. The MR4 value may be different than the calculated MR4 value Cal_MR4.

Figure 4:
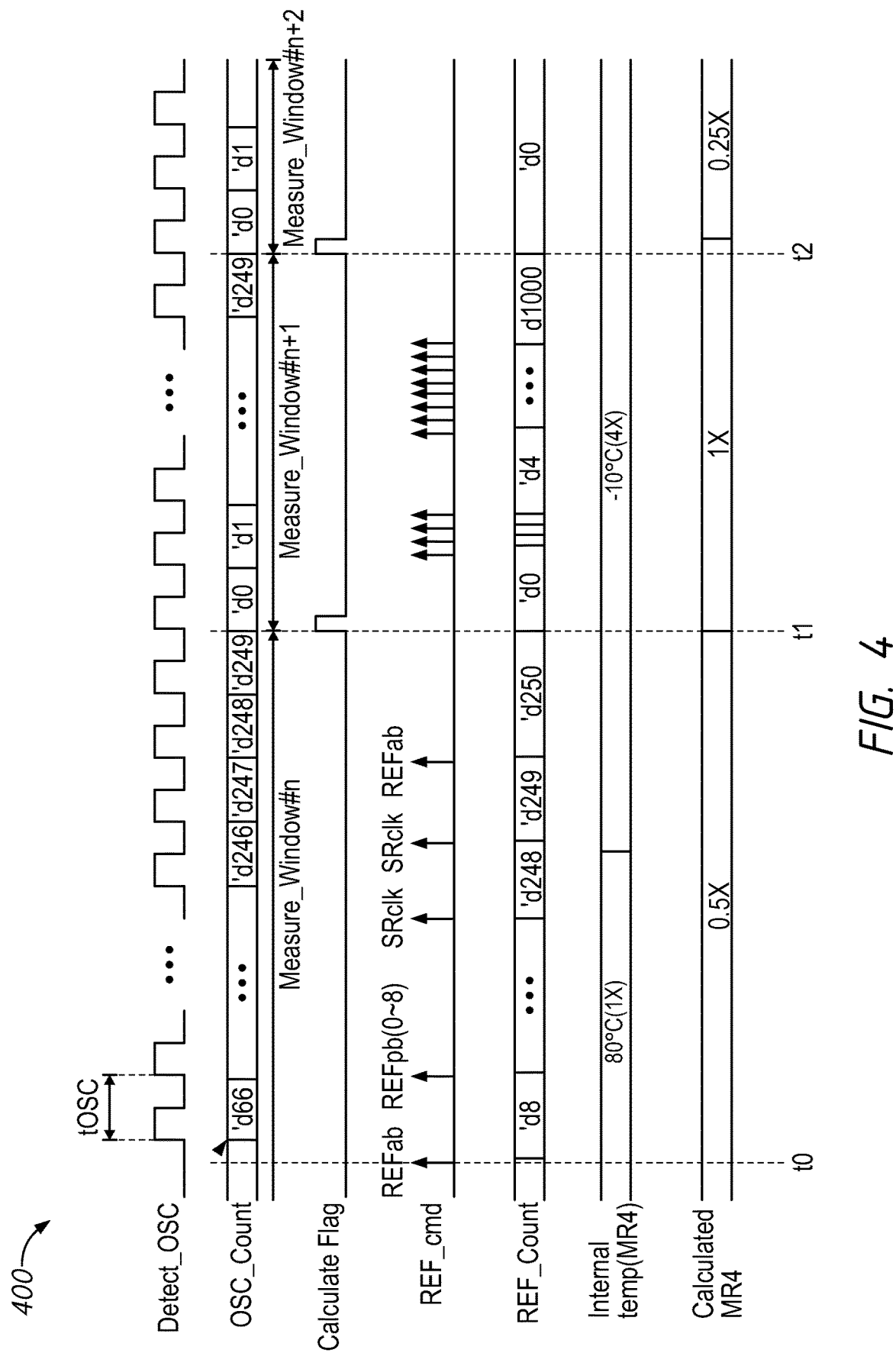
FIG. 4 is a timing diagram of signals relevant to a sample adjust circuit which uses measurement windows according to some embodiments of the present disclosure.

FIG. 4 is a timing diagram of signals relevant to a sample adjust circuit which uses measurement windows according to some embodiments of the present disclosure. The timing diagram 400 may, in some embodiments, reflect the operation of the sample adjust circuit 310 of FIG. 3.

The timing diagram 400 shows various signals including an oscillator signal OSC, an oscillator count OSC_C generated by an oscillator counter (e.g., 312 of FIG. 3) in response to the oscillator signal OSC, a calculate flag Calculate_Flag generated by a window control circuit (e.g., 314 of FIG. 3) in response to the oscillator count OSC_C, various refresh commands REF_cmd and a refresh count REF_C generated by a refresh counter (e.g., 316 of FIG. 3) in response to those commands, as well as a calculated MR4 value Cal_MR4 (e.g., generated by calculation circuit 318 of FIG. 3) and measured MR4 value.

At an initial time t0, the system is in an Nth measurement window. Each measurement window lasts for 250 cycles of the oscillator signal OSC, which is a periodic signal with tOSC of about 4 usec. These values are for illustrative purposes only and may be different in other example embodiments. At the initial time a rising edge after t0, the count OSC_C increases to 66. At the initial time a refresh command REFab is received which increases the count REF_C to 8 (e.g., because 7 previous refresh operations have been counted). The current internal temperature of the memory is 80° C., which would normally scale a sampling rate by 1×, however the calculated MR4 value Cal_MR4 is 0.5×, decreasing the sampling period and increasing a rate at which sampling occurs compared to the measured temperature.

Between the initial time t0 and a first time t1, various refresh commands are received which increase the refresh count REF_C to 250 at t1. At t1, the oscillator count OSC_C reaches a threshold value (e.g., 249) and the window control provides an activation of the calculate flag Calculate_Flag and a reset signal (not shown). Responsive to the reset signal the counts OSC_C and REF_C are reset to an initial value, 0. The activation of Calculate_Flag causes the calculation circuit to generate a new value of Cal_MR4 based on the value of REF_C just before t1. In this case, the REF_C value of 250 causes the Cal_MR4 to be set to 1×, even though the internal temperature has changed to −10° C. which would normally indicate a value of 4× (extreme temperature changes are used here for illustrative purposes).

Between the first time t1 and a second time t2, 1000 refresh operations are counted. At the time t2, the oscillator count OSC_C reaches 249 again, and the Calculate_Flag and reset signal are both provided again. Responsive to the Calculate_Flag and the REF_C value of 100, the value Cal_MR4 is set to 0.25×, even though the measured MR4 value still indicates a refresh interval multiplier of 4×.

Figure 5:
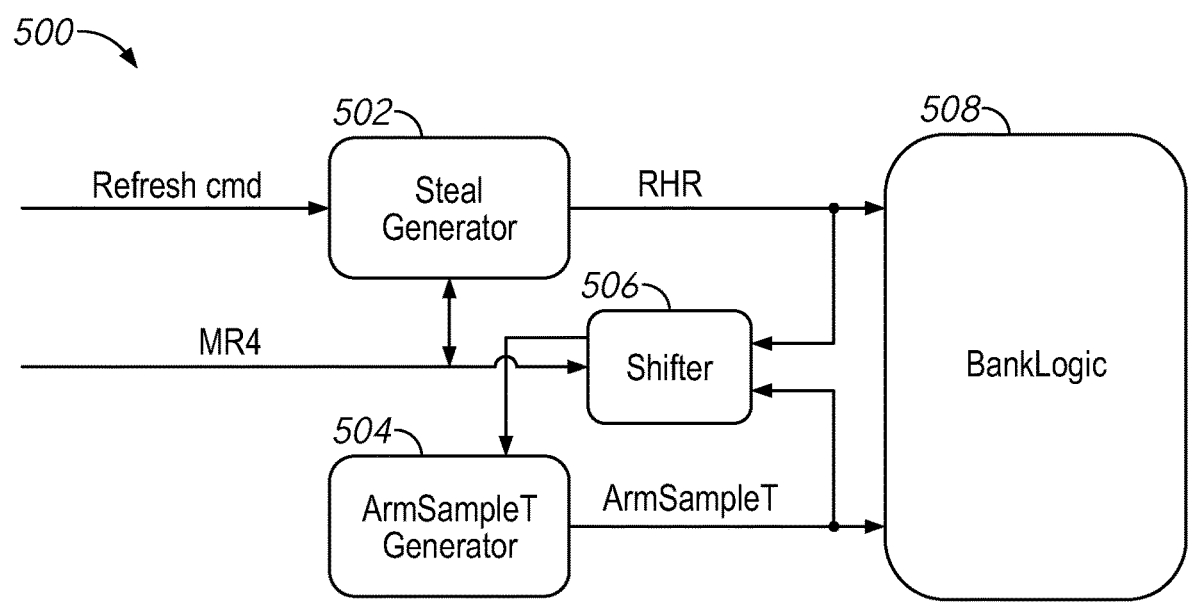
FIG. 5 is a block diagram of a refresh control circuit according to some embodiments of the present disclosure.

FIG. 5 is a block diagram of a refresh control circuit according to some embodiments of the present disclosure. The refresh control circuit 500 shows a portion of a refresh control circuit focused on the adjustment of a rate of a sampling signal. Other components and signals have been omitted from the view of FIG. 5 for brevity. The refresh control circuit 500 may, in some embodiments, be included in the refresh control circuit 116 of FIG. 1 and/or 216 of FIG. 2. In particular, the refresh control circuit 500 shows an embodiment which uses dynamic adjustment of the sampling rate.

The refresh control circuit 500 includes a steal generator 502, which may in some embodiments be a component of a state control circuit (e.g., 236 of FIG. 2). The steal generator determines when targeted refresh operations should be performed and provides a signal RHR when the targeted refresh operation should be performed. The steal generator circuit 502 may determine when to provide the signal RHR based on refresh commands, such as an RFM command, an AREF signal, etc., and a temperature setting MR4. The targeted refresh signal RHR is received by bank logic 508 which may include a refresh address generator (e.g., 238 of FIG. 2) a row decoder (e.g., 208 of FIG. 2) and/or other components. The refresh control circuit 500 also includes a time sample generator 504 (e.g., time based logic 240 of FIG. 2) which provides a signal ArmSampleT based on a calculated MR4 value Cal_MR4 provided by shifter circuit 506 (e.g., sample adjust circuit 242 of FIG. 2).

The shifter circuit 506 receives the signals, MR4, RHR and ArmSampleT, and sets the value of Cal_MR4 based on those signals. The shifter circuit 506 may determine a rate of RHR relative to a rate of ArmSampleT and generate Cal_MR4 by 'shifting' a value of MR4 one or more steps. For example, if MR4 has values 0.125×, 0.25×, 0.5×, 0.7×, 1×, 1.7×, 2×, 2.5×, 3.3×, 4×, 6×, and 8×, and the current value is 0.5×, and the shifter circuit 506 determines that more frequent sampling is required, then the shifter circuit 506 may produce Cal_MR4 with a value of 0.25× (e.g., one step from 0.5×) to reduce the sampling interval and increase the rate of sampling. If the shifter circuit 506 determines that further adjustment is required it may continue to shift steps until it determines that the rates of ArmSampleT and RHR are matched. In this manner the sampling rate of ArmSampleT (and thus the overall sampling signal ArmSample) may be dynamically adjusted.

The shifter circuit 506 may generate Cal_MR4 based on comparing the rates of ArmSampleT and RHR. For example, the shifter circuit 506 may include a count value. Each time RHR is received, the count value may be changed in a first direction (e.g., incremented) and each time ArmSampleT is received, the count value may be changed in a second direction (e.g., decremented). The shifter circuit 506 may have a window of acceptable values of the count value (e.g., between an upper and lower threshold). If the count value meets or exceeds an upper threshold, then the value of Cal_MR4 may be shifted one step in a direction and the count value reset to an initial value (e.g., a value between the thresholds). If the count value meets or falls below a lower threshold, then the value of Cal_MR4 may be shifted one step in an opposite direction and the count value reset to the initial value. The measured temperature value MR4 may be provided as the initial value of Cal_MR4 (e.g., after a power cycle, reset, etc.), and the value of Cal_MR4 may be shifted from that point forward.

For example, if the current value of MR4 is 1×, and RHR causes the count value to increase while ArmSample causes the count value to decrease, then the count value exceeding the upper threshold may cause Cal_MR4 to be provided as 0.7× (one step faster than MR4). If the count value crosses the upper threshold again, then Cal_MR4 becomes 0.5× and so forth. Starting from a value 1× again, if the count value falls below the lower threshold, then Cal_MR4 may be provided as 1.7× (e.g., one step slower). In this manner, the rate at which sampling occurs may be dynamically increased when there are more targeted refresh operations than sampling operations and dynamically decreased when there are fewer targeted refresh operations than sampling operations.

Figure 6:
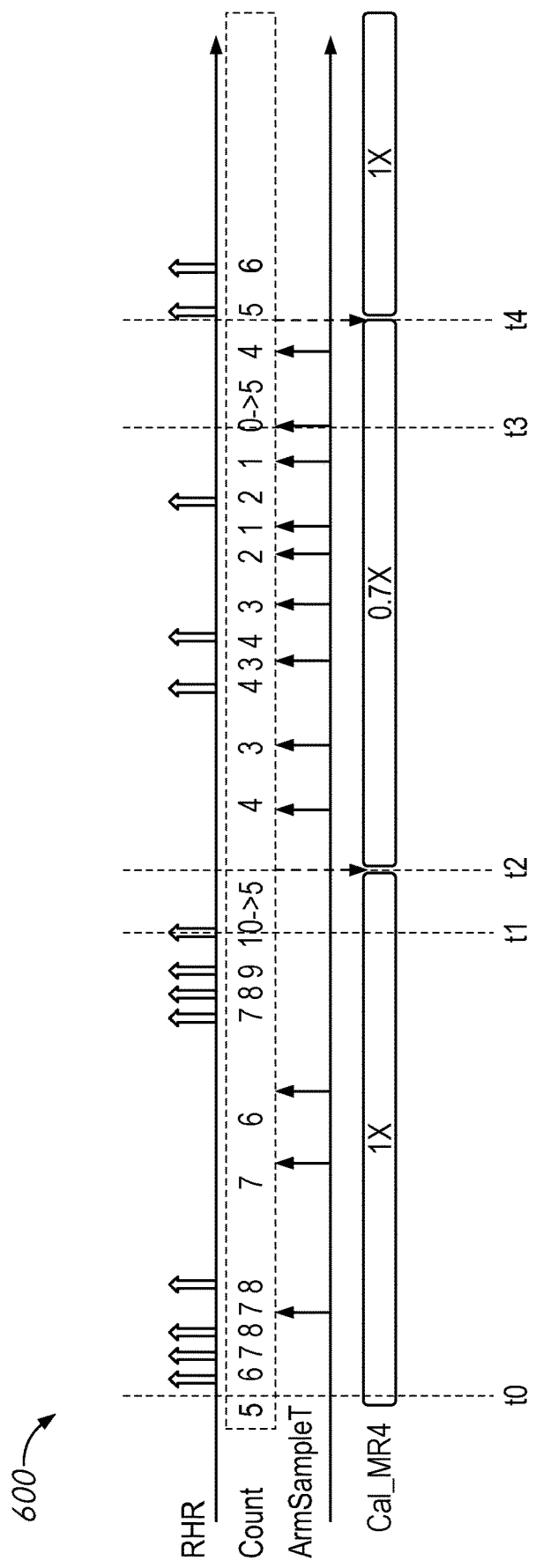
FIG. 6 is a timing diagram of signals relevant to a sample adjust circuit which uses dynamic adjustment according to some embodiments of the present disclosure.

FIG. 6 is a timing diagram of signals relevant to a sample adjust circuit which uses dynamic adjustment according to some embodiments of the present disclosure. The timing diagram 600 may, in some embodiments, represent the operation of the shifter circuit 506 of FIG. 5.

The timing diagram 600 shows a targeted refresh signal RHR, a count value which may be internal to a shifter circuit (e.g., 506 of FIG. 5), the time based sampling signal ArmSampleT, and the bin that the Cal_MR4 is in.

At an initial time t0, a count value in the shifter circuit is 5. In this example embodiment, the upper threshold is 10, and the lower threshold is 0. Accordingly, 5 may represent the initial value that the count is reset to, since it is between the two thresholds. At the initial time the value Cal_MR4 is at 1× (e.g., which may be based on the measured temperature value).

Between the initial time t0 and a first time t1, activations of the signal RHR are received, which cause the count value to be changed in a first direction by being incremented. So after a first RHR is received, the count value is 6, then after a second RHR the count value is 7, and so forth. When ArmSampleT is received, then the count value is changed in a second direction by being decremented. So after the count value reaches 8, an ArmSampleT is received and the count value Count returns to 7. The time between t0 and t1 represents a period where the rate of RHR is greater than the rate of ArmSampleT.

At the time t1, the count value reaches 10 after eight times that RHR is received and three times that ArmSampleT is received. Since the upper threshold is ten and the count now meets or exceeds that threshold, the count value is reset to its initial value of 5. At a time t2, the value of Cal_MR4 is shifted one step faster from its current value of 1× to a value of 0.7×. There may be a delay between the times t1 and t2 to represent the time it takes the shifter circuit to change the value of Cal_MR4.

Between a time t2 and t3, the rate of ArmSampleT is greater than the rate of RHR. Accordingly, the count may generally decrease more than it increases between the times t2 and t3 until at time t3, the count reaches 0. Since the value 0 now meets or falls below the lower threshold (0), then the count value is reset to its initial value (5), and shortly after t3 at a time t4, the value Cal_MR4 moves a step slower from its current value of 0.7× to a new value of 1×.

Figure 7:
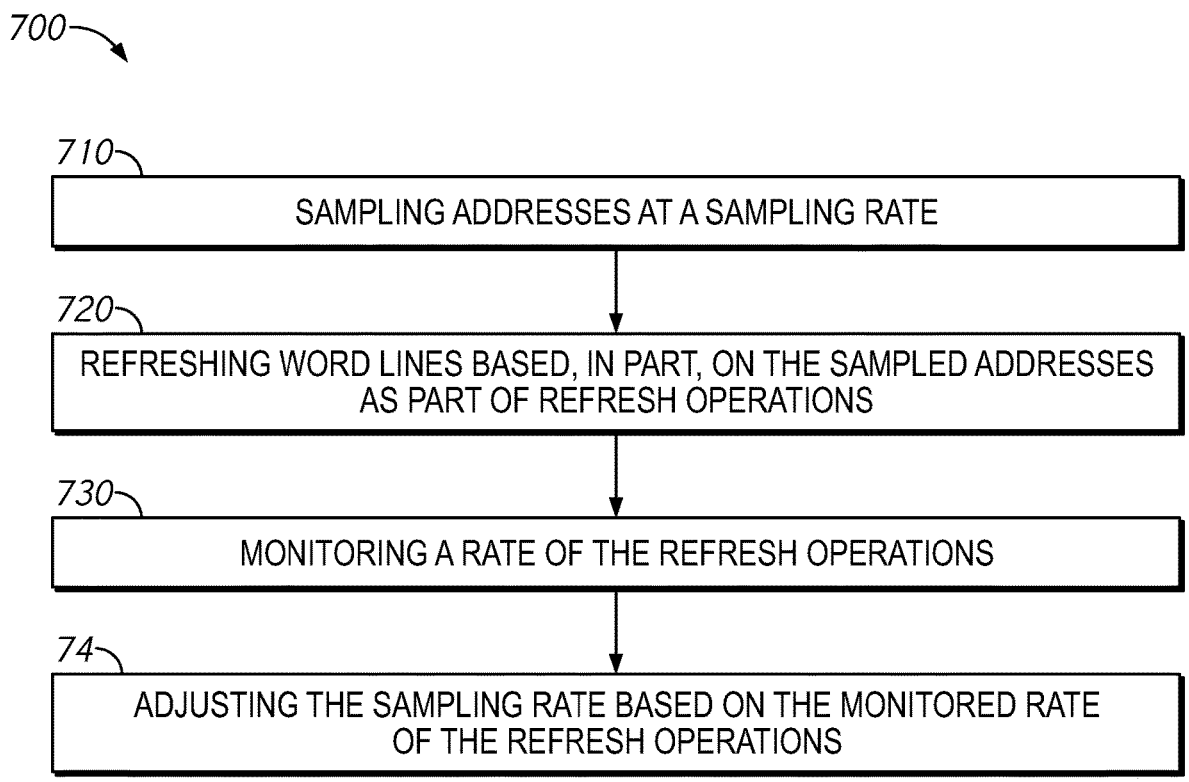
FIG. 7 is a flow chart of a method according to some embodiments of the present disclosure.

FIG. 7 is a flow chart of a method according to some embodiments of the present disclosure. The method 700 may, in some embodiments, be performed by one or more of the apparatuses or systems of FIGS. 1-6.

The method 700 includes box 710, which describes sampling an address with timing based, in part, on a sampling rate. The address may be a row address (e.g., XADD) along an address bus provided by an address decoder (e.g., 104 of FIG. 1). The method 700 may include generating an activation based sampling signal (e.g., ArmSampleA) based on activations of an activation signal (e.g., ACT) and generating a timing based sampling signal (e.g., ArmSampleT) based on the sampling period. The method 700 may include providing an overall sampling signal (e.g., ArmSample) based on the activation based sampling signal and the time based sampling signal and sampling the address responsive to the sampling signal.

The method 700 includes box 720, which describes refreshing word lines based, in part, on the sampled addresses as part of refresh operations. For example, the method may include identifying an aggressor address based on the sampled addresses, generating refresh address based on the aggressor address and refreshing one or more word lines based on the refresh address as part of a targeted refresh operation. The method 700 may include generating a targeted refresh signal (e.g., RHR) and performing the targeted refresh operation responsive to the targeted refresh signal. The method 700 may include measuring a temperature of the memory (e.g., to generate an MR4 value) and setting a rate of targeted refresh operations based on the measured temperature.

The method 700 includes box 730, which describes monitoring a rate of refresh operations and box 740, which describes adjusting the sampling rate based on the monitored rate of the refresh operations. For example, the method 700 may include generating a calculated temperature value (e.g., Cal_MR4) and adjusting the sampling rate based on the calculated temperature value.

In some embodiments, the method 700 may include counting a number of refresh operations within a measurement window and adjusting the sampling rate based on the counted number of refresh operations. For example, the method 700 may include changing a count value by a first amount responsive to a first type of refresh command and changing the count value by a second amount responsive to a second type of refresh command. The method 700 may include counting oscillations of an oscillation signal (e.g., OSC) and providing a calculate flag (e.g., Calculate_Flag) when the count (e.g., OSC_C) reaches a threshold. Responsive to the calculate flag, a calculated temperature may be generated based on the current count of refresh operations.

In some embodiments, the method 700 may include changing a count value in a first direction (e.g., incrementing) responsive to the targeted refresh operations, changing the count value in a second direction (e.g., decrementing) responsive to the sampling signal, and adjusting the sampling rate based on the count value. For example, the method 700 may include changing a current sampling rate by a step in a direction (e.g., a step faster) based on the count value meeting or passing a first threshold (e.g., meeting or exceeding an upper threshold), and changing the current sampling rate by a step in a second direction (e.g., a step slower) based on the count value meeting or passing a second threshold (e.g., meeting or falling below a lower threshold).

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
a sample timing circuit configured to provide activations of a sampling signal based, in part, on a sampling rate; and
a sample adjustment circuit configured to monitor a rate of refresh operations and adjust the sampling rate based on the rate of the refresh operations,
wherein the sample adjustment circuit is configured to count a number of refresh operations in a measurement window and generate a calculated temperature value based on the count, and
wherein the sample adjustment circuit is configured to set the sampling rate based on the calculated temperature value.

2. The apparatus of claim 1, further comprising:
a refresh state control circuit configured to perform the refresh operations, wherein the rate of the refresh operations is based, in part, on a measured temperature value,
wherein the sample adjustment circuit is configured to generate a calculated temperature value, and
wherein the sampling rate is based on the calculated temperature value.

3. The apparatus of claim 1, further comprising an aggressor detector circuit configured to sample an address responsive to each of the activations of the sampling signal and determine an aggressor address based on the sampled address.

4. The apparatus of claim 1, wherein the sample timing circuit includes:
activation based sample logic configured to provide activations of an activation based sampling signal based on an activation signals; and
time based sample logic configured to provide activations of a time based sampling signal based on the sampling rate, wherein the sampling signal is based on the activation based sampling signal and the time based sampling signal.

5. An apparatus comprising:
a sample timing circuit configured to provide activations of a sampling signal based, in part, on a sampling rate; and
a sample adjustment circuit configured to monitor a rate of refresh operations and adjust the sampling rate based on the rate of the refresh operations, wherein the sample adjustment circuit is configured to change a count value in a first direction responsive to a targeted refresh operation, change the count value in a second direction responsive to each of the activations of the sampling signal, and generate a calculated temperature value based on the count value and a measured temperature value, and
wherein the sample adjustment circuit is configured to set the sampling rate based on the calculated temperature value.

6. The apparatus of claim 5, wherein the sample adjustment circuit is configured to generate the calculated temperature value by shifting a current calculated temperature value a step in a direction when the count value meets or exceeds a threshold and resetting the count value, and is configured to generate the calculated temperature value by shifting the current calculated temperature value a step in an opposite direction when the count value meets or falls below a second threshold and resetting the count value.

7. A method comprising:
sampling addresses with timing based, in part, on a sampling rate;
refreshing word lines based, in part, on the sampled addresses as part of refresh operations;
monitoring a rate of refresh operations by counting a number of the refresh operations within a measurement window;
generating a calculated temperature value based on the count; and
adjusting the sampling rate based on the calculated temperature value.

8. The method of claim 7, further comprising:
determining a rate of the refresh operations based, in part, on a measured temperature;
generating a calculated temperature based on the monitored rate of the refresh operations; and
adjusting the sampling rate based on the calculated temperature.

9. The method of claim 7, further comprising:
generating a time based sampling signal based on the sampling rate;
generating an activation based sampling signal based on an activation signal;
generating a sampling signal based on the time based sampling signal and the activation based sampling signal; and
sampling the addresses responsive to the sampling signal.

10. A method comprising:
sampling addresses with timing based, in part, on a sampling rate;
refreshing word lines based, in part, on the sampled addresses as part of refresh operations;
monitoring a rate of refresh operations;
adjusting the sampling rate based on the monitored rate of the refresh operations, wherein the refresh operations include targeted refresh operations;
sampling the addresses responsive to a sampling signal, wherein the sampling signal is generated with timing based, in part, on the sampling rate;
changing a count value in a first direction responsive to the targeted refresh operations;
changing the count value in a second direction responsive to the sampling signal; and
adjusting the sampling rate based on the count value.

11. The method of claim 10, further comprising:
changing a current sampling rate by a step in a direction based on the count value meeting or passing a first threshold; and
changing the current sampling rate by a step in a second direction based on the count value meeting or passing a second threshold.

* * * * *